United States Patent
Hung

(10) Patent No.: US 10,388,613 B2
(45) Date of Patent: Aug. 20, 2019

(54) METHOD FOR SUPPRESSING MATERIAL WARPAGE BY MEANS OF PRESSURE DIFFERENCE

(71) Applicant: ABLEGO TECHNOLOGY CO., LTD., Hsinchu (TW)

(72) Inventor: Shu-Hui Hung, Hsinchu (TW)

(73) Assignee: ABLEGO TECHNOLOGY CO., LTD., Hsinchu (TW)

( * ) Notice: Subject to any disclaimer, the term of this patent is extended or adjusted under 35 U.S.C. 154(b) by 171 days.

(21) Appl. No.: 15/491,971

(22) Filed: Apr. 19, 2017

(65) Prior Publication Data

US 2017/0323856 A1 Nov. 9, 2017

(30) Foreign Application Priority Data

May 9, 2016 (TW) .............................. 105114374 A

(51) Int. Cl.
| | |
|---|---|
| *H05K 3/00* | (2006.01) |
| *H01L 23/00* | (2006.01) |
| *H01L 21/48* | (2006.01) |
| *H01L 21/67* | (2006.01) |
| *H01L 21/673* | (2006.01) |
| *H01L 21/56* | (2006.01) |

(52) U.S. Cl.
CPC ........ *H01L 23/562* (2013.01); *H01L 21/4842* (2013.01); *H01L 21/4846* (2013.01); *H01L 21/56* (2013.01); *H01L 21/67017* (2013.01); *H01L 21/6732* (2013.01); *H01L 21/67092* (2013.01); *Y10T 29/49124* (2015.01)

(58) Field of Classification Search
CPC ... H01L 21/56; H01L 23/562; H01L 21/4846; H01L 21/4842; H01L 21/67092; H01L 21/6732; H01L 2924/3511; H01L 2224/82047; Y10T 29/49002; Y10T 156/1028; Y10T 29/49124
USPC ................ 29/829, 402.1, 402.19, 592.1, 835
See application file for complete search history.

(56) References Cited

U.S. PATENT DOCUMENTS

| | | | |
|---|---|---|---|
| 5,481,482 A | 1/1996 | Nagai et al. | |
| 6,481,482 B1 * | 11/2002 | Shimotomai | B32B 17/06 100/322 |

(Continued)

FOREIGN PATENT DOCUMENTS

| | | |
|---|---|---|
| CN | 101183696 A | 5/2008 |
| JP | H110275852 A | 10/1998 |

(Continued)

*Primary Examiner* — Thiem D Phan

(57) ABSTRACT

A method for suppressing material warpage by means of a pressure difference comprises the following steps: a. preparing a plurality of carrier boards; b. preparing a plurality of carrier board pressing devices having an upper surface and a lower surface on which at least one air bag is provided; c. adjusting the processing chamber to be a working temperature and a working pressure, so that the carrier boards and the carrier board pressing devices placed therein are surrounded by the working temperature and the working pressure; d. effectively suppressing warpage of the carrier board by using a pressure difference between a first predetermined pressure in the air bag and the working pressure of the processing chamber. Thereby, production quality of carrier board is significantly improved, as well as the cost for production of which is effectively reduced.

9 Claims, 2 Drawing Sheets

(56) References Cited

U.S. PATENT DOCUMENTS

| 8,028,735 B2 * | 10/2011 | Chikaki ................... B30B 5/02 |
| | | 156/382 |
| 8,540,002 B2 * | 9/2013 | Sampica ........... B32B 17/10018 |
| | | 156/381 |
| 2002/0171129 A1 | 11/2002 | Huang et al. |
| 2004/0107569 A1 | 6/2004 | Guzek et al. |
| 2006/0180944 A1 | 8/2006 | Chang et al. |
| 2008/0222884 A1 | 9/2008 | Bradley et al. |
| 2011/0018130 A1 | 1/2011 | Yamada et al. |

FOREIGN PATENT DOCUMENTS

| JP | 2015065298 A | 4/2015 |
| JP | 2015079832 A | 4/2015 |

* cited by examiner

METHOD FOR SUPPRESSING MATERIAL WARPAGE BY MEANS OF PRESSURE DIFFERENCE

CROSS-REFERENCE TO RELATED APPLICATIONS

The present application claims the benefit of Taiwanese Patent Application No. 105114374 filed on May 9, 2016, the entire contents of which are hereby incorporated by reference.

BACKGROUND OF THE INVENTION

Field of the Invention

The present invention relates to the technical field of electronic packaging, and in particular, technically provides a method for suppressing material warpage by means of a pressure difference, in which an acting force is applied to a first surface of a carrier board by using a pressure difference between a first predetermined pressure in an air bag and a working pressure of a processing chamber, to effectively suppress warpage of the carrier board, thus significantly improving production quality of the carrier board and effectively reducing production costs.

Description of the Related Art

In recent years, electronic technologies progress with each passing day, and electronic products consisting of integrated circuit elements have become indispensable tools in daily life of modern people. As the electronic products are designed to be light, thin, short, and small, many high-density semiconductor packaging forms are correspondingly developed in semiconductor packaging technologies. When a package structure is put into mass production, generally, a plurality of semiconductor chips or electronic elements are fixedly disposed on a substrate, and then a sealing process is carried out. Next, the package substrate is cut, to form a plurality of package units. However, because the coefficients of thermal expansion of a sealant material used in the sealing process and the package substrate are different coefficients, in a curing process after sealing, the package substrate and the sealant material generate different thermal expansion or thermal contraction as the temperature changes, and as a result, the package substrate produces a thermal stress which causes warpage. Moreover, during curing, as the temperature increases or time goes by, the warpage generated by the package substrate is more severe, making it difficult to carry out the follow-up subsequent cutting process. Furthermore, the package substrate generates a bending moment that is exerted on the semiconductor chip or electronic element, and if the bending moment is excessively large, it may even damage the semiconductor chip or electronic element. In addition, in the packaging process, in order to avoid warpage caused by different deformation quantities of the substrate and the chip due to an excessively large difference between the coefficients of thermal expansion, the substrate is made of a material having a coefficient of thermal expansion close to that of the chip (whose major ingredient is silicon) as much as possible; this extremely limits the use of substrate materials, and it is necessary to make an improvement.

Therefore, in view of the above problem of warpage caused by a thermal stress in the existing package structure, how to develop a more ideal, practical, and economically efficient method for suppressing material warpage is a research objective and direction for those in related industries.

Accordingly, the inventor, with years of experience in manufacturing development and design of related products, finally proposes the present invention, which indeed has practicability, after comprehensive design and careful assessment for the above objective.

SUMMARY OF THE INVENTION

《Technical Problem to be Solved》

In an existing package structure, because the coefficients of thermal expansion of a sealant material used in a sealing process and a package substrate are different, the package substrate produces a thermal stress as the temperature changes, thus generating warpage; this seriously affects the reliability and quality of products, and it is necessary to make an improvement.

《Technical Means》

To improve the foregoing problem, the present invention provides a method for suppressing material warpage by means of pressure difference, which includes the following steps: a. Prepare a plurality of carrier boards, each carrier board having a first surface and a second surface that are opposite to each other.

b. Prepare a plurality of carrier board pressing devices, wherein the carrier board pressing devices are parallelly disposed on a sliding groove at an inner side of a processing frame; the carrier board pressing device includes at least one air inlet, at least one air outlet, at least one air bag, and at least one air passage; the at least one air inlet is connected to a pneumatic supply; the carrier board pressing device has an upper surface and a lower surface that are opposite to each other; the lower surface is provided with the at least one air bag; the upper surface is provided with the at least one carrier board corresponding to the at least one air bag disposed on another carrier board pressing device next above the carrier board pressing device, such that the at least one second surface is able to contact with the upper surface; one end of the at least one air passage is combined with the at least one air inlet and the at least one air outlet, and the other end is combined with the at least one air bag; the air bag and the air passage are in communication and form a confined space; in addition, no carrier board is disposed on the upper surface of the carrier board pressing device at a top layer.

c. Adjusting the processing chamber to be a working temperature and a working pressure, so that the carrier boards and the carrier board pressing devices placed therein are surrounded by the working temperature and the working pressure.

d. Fill air into the air bags via the air inlets by using the pneumatic supply, such that air flows into the air bags through the air passages, the air bags are filled with air till a first predetermined pressure is reached, and the exterior of the air bags is pressed against the first surfaces of the carrier boards; by using a pressure difference between the first predetermined pressure in each air bag and the working pressure of the processing chamber, the thermal stresses of the carrier boards caused by material thermal expansion under the working pressure of the processing chamber are overcome to effectively suppress warpage of the carrier boards, wherein the first predetermined pressure in the air bags is greater than the working pressure of the processing chamber, and the pressure difference is greater than 0.01 atm.

e. Related processes of the carrier boards are completed in the processing chamber; the working temperature is decreased to an initial temperature (room temperature), and the working pressure is decreased to an initial pressure (room pressure); connect a vacuum generator to each air outlet, and by using the vacuum generator, pressures in each air passage and each air bag are decreased to a second predetermined pressure, which is a vacuum pressure, and the air bags are adsorbed on the lower surfaces of the carrier board pressing devices by using a vacuum suction, so that the carrier boards are taken out easily, wherein a variation range of the second predetermined pressure is set between 0.01 Torr and 760 Torr, and the air inlet and air outlet on each carrier board pressing device may also be combined into an air port that can be connected to both the pneumatic supply and the vacuum generator. In addition, this step may also be performed before the carrier board is placed into the carrier board pressing device, to make more operation room and effectively reduce manual operation costs.

According to the description above, the carrier board is at least one of a printed circuit board, an organic substrate, a glass substrate, a metal substrate, a lead frame, a wafer, a silicon interposer, and a package.

According to the description above, the carrier board pressing device is slidably sleeved on sliding groove at the inner side of the processing frame.

According to the description above, the at least one air bag is fixedly disposed on the lower surface of the carrier board pressing device by using at least one sealing structure.

According to the description above, the pneumatic supply is an air compressor or an air pipeline of factory.

According to the description above, the vacuum generator is a vacuum pump.

According to the description above, the air bag is made of a polyimide or Teflon material.

According to the description above, below the at least one air bag on the lowest one of the carrier board pressing device, a parallel stowing plate may be further disposed on the sliding groove at the inner side of the processing frame, and an upper surface of the stowing plate is provide with at least one carrier board corresponding to the at least one air bag on the lowest one of the carrier board pressing device, carrier board is disposed on, such that the at least one second surface is able to contact with the upper surface of the stowing plate.

According to the description above, the stowing plate is slidably sleeved on the sliding groove at the inner side of the processing frame.

According to the description above, the working temperature in the processing chamber is set in a range from room temperature to 800 degrees centigrade, and a variation range of the working pressure is set between 1.01 atm and 100 atm.

According to the description above, a variation range of the second predetermined pressure is set between 0.01 Torr to 760 Torr.

According to the description above, the carrier board pressing devices may be connected to respective pneumatic supplies or share one pneumatic supply.

According to the description above, the carrier board pressing devices may be connected to respective vacuum generators or share one vacuum generator.

(Effects)

According to the method for suppressing material warpage by means of a pressure difference in the present invention, space between carrier board pressing devices and the number of carrier board pressing devices used may be adjusted according to requirements of processes, to effectively improve the flexibility of using the processes; an acting force is applied on a first surface of a carrier board by using a pressure difference between a first predetermined pressure in an air bag and a working pressure of a processing chamber, to effectively suppress warpage of the carrier board, thus significantly improving production quality of the carrier board and effectively reducing production costs; the air bags are adsorbed on lower surfaces of the carrier board pressing devices by using a vacuum suction, and the carrier boards can be easily placed into and taken out of the carrier board pressing devices without manually moving the air bags, thus effectively reducing manual operation costs.

Technologies and means used in the present invention and effects thereof are described in detail below by using a preferred embodiment and with reference to the accompanying drawings, such that the above objectives, structures, and features of the present invention will be thoroughly understood.

REFERENCE NUMBERS

Figure 1:
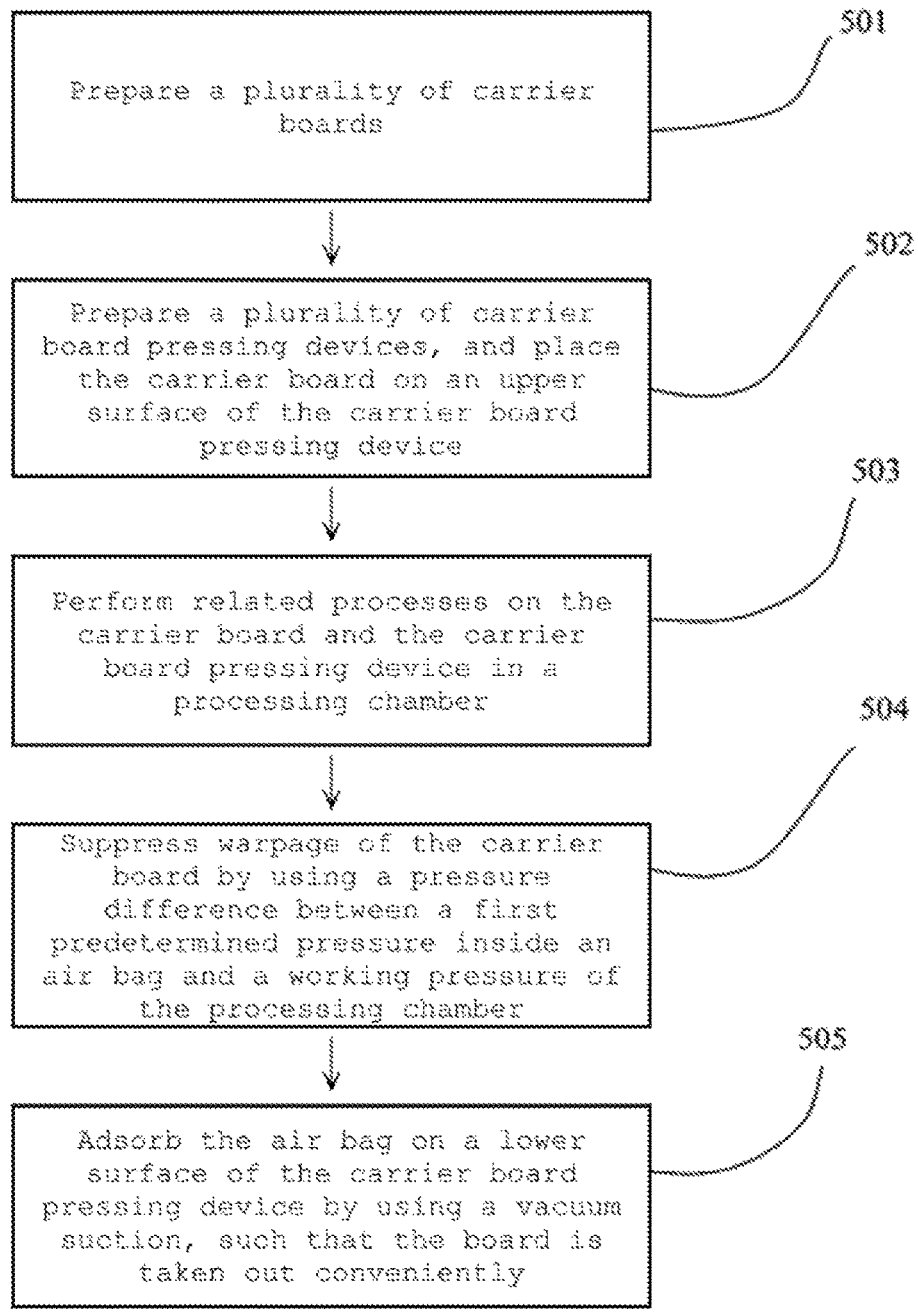
FIG. 1 is a flowchart of a method for suppressing material warpage by means of a pressure difference according to a preferred embodiment of the present invention.

501-505 Steps
10 Carrier board
11 First surface
12 Second surface
20 Carrier board pressing device
201 Upper surface
202 Lower surface
21 Air inlet
22 Air outlet
23 Air bag
24 Sealing structure
25 Air passage
26 Pneumatic supply
27 Stowing plate
28 Vacuum generator
30 Processing frame
31 Sliding groove
40 Processing chamber

DETAILED DESCRIPTION OF THE PREFERRED EMBODIMENTS

Figure 2:
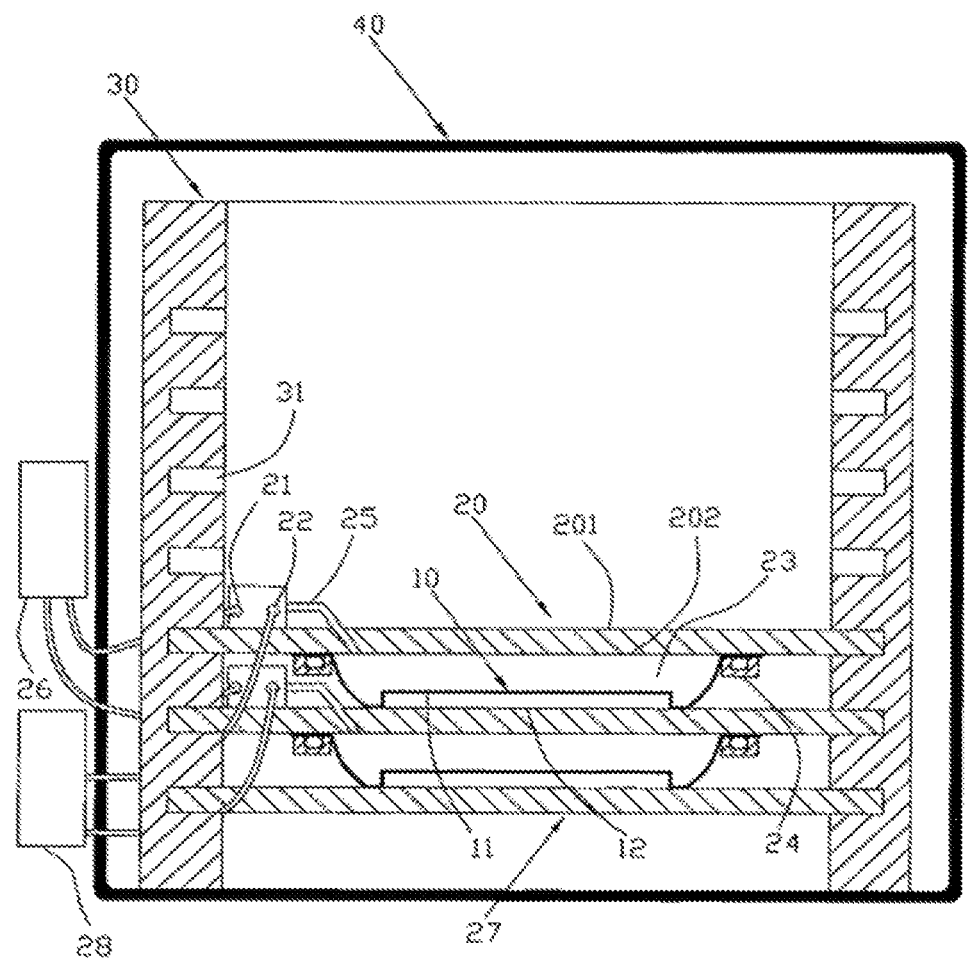
FIG. 2 is a schematic diagram of a pressed state of air bags according to a preferred embodiment of the present invention.

Referring to FIG. 1 to FIG. 2, the present invention provides a method for suppressing material warpage by means of a pressure difference, including the following steps: a. (Step 501): Prepare a plurality of carrier boards 10, where each carrier board 10 has a first surface 11 and a second surface 12 that are opposite to each other, and the carrier board 10 is at least one of a printed circuit board, an organic substrate, a glass substrate, a metal substrate, a lead frame, a wafer, a silicon interposer, and a package.

b. (Step 502): Prepare a plurality of carrier board pressing devices 20, wherein the carrier board pressing devices 20 are parallel with each other and slidably disposed on a sliding groove 31 at an inner side of a processing frame 30; the carrier board pressing device 20 includes at least one air inlet 21, at least one air outlet 22, at least one air bag 23, at least one sealing structure 24, and at least one air passage 25; the at least one air inlet 21 is connected to a pneumatic supply 26, and the pneumatic supply 26 is an air compressor or a air pipeline of factory; the carrier board pressing device 20 has an upper surface 201 and a lower surface 202 that are opposite to each other; the lower surface 202 is provided with the at least one air bag 23 by using the at least one sealing structure 24, and the sealing structure 24 is, for example, a combination of a pressing ring, an O-shaped ring and the like; corresponding to the at least one air bag 23 disposed on another carrier board pressing device 20 next above the carrier board pressing device 20, the at least one carrier board 10 is disposed on the upper surface 201, such that the at least one second surface 12 is able to contact with the upper surface 201; one end of the at least one air passage 25 is combined with the at least one air inlet 21 and the at least one air outlet 22, and the other end is combined with the at least one air bag 23; the air bag 23 is made of a polyimide or Teflon material; the air bag 23 and the air passage 25 are in communication and form a confined space; wherein below the at least one air bag 23 on the lowest one of the carrier board pressing device 20, a stowing plate 27 may be further slidably and parallelly disposed on the sliding groove 31 at the inner side of the processing frame 30; corresponding to the at least one air bag 23 on the lowest one of the carrier board pressing device 20, at least one carrier board 10 is disposed on an upper surface of the stowing plate 27, such that the at least one second surface 12 is able to contact with the upper surface of the stowing plate 27; in addition, no carrier board 10 is disposed on the upper surface 201 of a top layer of the carrier board pressing device 20.

c. (Step 503): Adjusting the processing chamber 40 to be a working temperature and a working pressure, so that the carrier boards 10 and the carrier board pressing devices 20 placed therein are surrounded by the working temperature and the working pressure to perform related processes such as curing and devoiding after sealing; the working temperature in the processing chamber 40 is set in a range from 20 degrees centigrade (room temperature) to 800 degrees centigrade, and a variation range of the working pressure is set between 1.01 atm and 100 atm.

d. (Step 504): Fill air into the air bags 23 via the air inlets 21 by using the pneumatic supply 26, such that air flows into the air bags 23 through the air passages 25, the air bags 23 are filled with air till a first predetermined pressure is reached, and the exterior of the air bags 23 is pressed against the first surfaces 11 of the carrier boards 10; by using a pressure difference between the first predetermined pressure in each air bag 23 and the working pressure of the processing chamber 40, thermal stresses of the carrier boards 10 generated due to material thermal expansion under the working temperature of the processing chamber 40 are overcome, to effectively suppress warpage of the carrier boards 10, wherein the first predetermined pressure in the air bags 23 is greater than the working pressure of the processing chamber 40, and the pressure difference is greater than 0.01 atm.

e. (Step 505): Complete related processes of the carrier boards 10 in the processing chamber 40; decrease the working temperature to an initial temperature (room temperature), and decrease the working pressure to an initial pressure (room pressure); connect a vacuum generator 28 to each air outlet 22, wherein the vacuum generator 28 is a vacuum pump, and meanwhile, turn off the pneumatic supply 26 and turn on the vacuum generator 28; by using the vacuum generator 28, pressures in each air passage and air bag are decreasing to a second predetermined pressure, which is a vacuum pressure, and the air bags 23 are adsorbed on the lower surfaces 202 of the carrier board pressing devices 20 by using a vacuum suction, so that the carrier boards 10 are taken out easily, wherein a variation range of the second predetermined pressure is set between 0.01 Torr and 760 Torr. In addition, this step may be performed before the carrier board 10 is placed into the carrier board pressing device 20 in Step 502, to make more operation room and effectively reduce manual operation costs.

According to the method for suppressing material warpage by means of a pressure difference in the present invention, space between carrier board pressing devices 20 and the number of carrier board pressing devices 20 used may be adjusted according to requirements of the processes in Step 502, to effectively improve the flexibility of using the processes.

According to the method for suppressing material warpage by means of a pressure difference in the present invention, an acting force is applied to the first surface 11 of each carrier board 10 by using a pressure difference between the first predetermined pressure in each air bag 23 and the working pressure of the processing chamber 40 in Step 504, to effectively suppress warpage of each carrier board 10, thus significantly improving production quality of the carrier board 10 and effectively reducing production costs.

According to the method for suppressing material warpage by means of a pressure difference in the present invention, in Step 505, the air bags 23 are adsorbed on the lower surfaces 202 of the carrier board pressing devices 20 by using a vacuum suction, and the carrier boards 10 can be easily taken out without manually moving the air bags 23, thus effectively reducing manual operation costs.

The technical solutions of the present invention are described in detail above by using the preferred embodiment of the present invention. Changes and modifications may be made by persons skilled in the art without departing from the spirit and principle of the present invention, and all such changes and modifications should be covered in the scope defined by the claims below.

What is claimed is:

1. A method for suppressing material warpage by means of a pressure difference, comprising the following steps:
   (a) preparing a plurality of carrier boards, each carrier board having a first surface and a second surface that are opposite to each other;
   (b) preparing a plurality of carrier board pressing devices, the carrier board pressing devices being parallelly and slidably sleeved on an inner side of a processing frame, the carrier board pressing device comprising at least one air inlet, at least one air outlet, at least one air bag, and at least one air passage, the at least one air inlet being connected to a pneumatic supply, the carrier board pressing devices having an upper surface and a lower surface that are opposite to each other, the lower surface being provided with the at least one air bag, the upper surface being provided with the at least one carrier board corresponding to the at least one air bag disposed on another one of the carrier board pressing devices next above the carrier board pressing device, one end of the at least one air passage being combined with the at least one air inlet and the at least one air outlet, and the other end being combined with the at least one air bag, and the air bag and the air passage being in communication and forming a confined space;

(c) adjusting the processing chamber to be a working temperature and a working pressure, so that the carrier boards and the carrier board pressing devices placed therein are surrounded by the working temperature and the working pressure;

(d) filling air into the air bags by using the pneumatic supply, such that air flows into the air bags through the air passages, the air bags are filled with air till a first predetermined pressure is reached, and the exterior of the air bags is pressed against the first surfaces of the carrier boards, by using a pressure difference between the first predetermined pressure in each air bag and the working pressure of the processing chamber, the thermal stresses of the carrier boards caused by material thermal expansion are overcome, to suppress warpage of the carrier boards, wherein the first predetermined pressure in the air bags is greater than the working pressure of the processing chamber, and the pressure difference is greater than 0.01 atm.

2. The method for suppressing material warpage by means of a pressure difference according to claim 1, further comprising the following step: connecting each air outlet to a vacuum generator, by using the vacuum generator, pressures in the air passages and the air bags to a second predetermined pressure are decreased, which is a vacuum pressure, and adsorbing the air bags on the lower surfaces of the carrier board pressing devices by using a vacuum suction, such that the carrier boards are taken out conveniently.

3. The method for suppressing material warpage by means of a pressure difference according to claim 2, wherein a variation range of the second predetermined pressure is set between 0.01 Torr to 760 Torr.

4. The method for suppressing material warpage by means of a pressure difference according to claim 1, wherein the at least one air bag is fixedly disposed on the lower surface of the carrier board pressing device by using at least one sealing structure.

5. The method for suppressing material warpage by means of a pressure difference according to claim 1, wherein the carrier board is at least one of a printed circuit board, an organic substrate, a glass substrate, a metal substrate, a lead frame, a wafer, a silicon interposer, and a package.

6. The method for suppressing material warpage by means of a pressure difference according to claim 1, wherein the air bag is made of a polyimide or Teflon material.

7. The method for suppressing material warpage by means of a pressure difference according to claim 1, wherein the working temperature in the processing chamber is set in a range from 20 degrees centigrade to 800 degrees centigrade, and a variation range of the working pressure is set between 1.01 atm and 100 atm.

8. The method for suppressing material warpage by means of a pressure difference according to claim 1, wherein below the at least one air bag on the lowest one of the carrier board pressing devices, a parallel stowing plate is further disposed on the inner side of the processing frame, and corresponding to the at least one air bag on the lowest one of the carrier board pressing device, at least one carrier board is disposed on an upper surface of the stowing plate.

9. The method for suppressing material warpage by means of a pressure difference according to claim 8, wherein the stowing plate is slidably sleeved on the inner side of the processing frame.

* * * * *